(12) United States Patent
Choi et al.

(10) Patent No.: US 9,466,586 B1
(45) Date of Patent: Oct. 11, 2016

(54) METHOD FOR MANUFACTURING WAFER-LEVEL FAN-OUT PACKAGE

(71) Applicant: STS Semiconductor & Telecommunications Co., Ltd., Chungcheongnam-do (KR)

(72) Inventors: Jai Kyoung Choi, Busan (KR); Eun Dong Kim, Seoul (KR); Hyun Hak Jung, Chungcheongnam-do (KR); Hyeong Min Kim, Gangwon-do (KR); Su Kyung Lim, Gyeongsangbuk-do (KR)

(73) Assignee: STS SEMICONDUCTOR & TELECOMMUNICATIONS CO., LTD. (KR)

( * ) Notice: Subject to any disclaimer, the term of this patent is extended or adjusted under 35 U.S.C. 154(b) by 0 days.

(21) Appl. No.: 14/794,185

(22) Filed: Jul. 8, 2015

(30) Foreign Application Priority Data

Jun. 4, 2015 (KR) .......................... 10-2015-0079377

(51) Int. Cl.
| | |
|---|---|
| *H01L 23/00* | (2006.01) |
| *H01L 21/78* | (2006.01) |
| *H01L 21/027* | (2006.01) |
| *H01L 21/288* | (2006.01) |
| *H01L 21/768* | (2006.01) |
| *H01L 21/56* | (2006.01) |

(52) U.S. Cl.
CPC ............ *H01L 24/97* (2013.01); *H01L 21/0273* (2013.01); *H01L 21/288* (2013.01); *H01L 21/56* (2013.01); *H01L 21/76877* (2013.01); *H01L 21/78* (2013.01); *H01L 24/83* (2013.01); *H01L 2224/32225* (2013.01); *H01L 2224/838* (2013.01)

(58) Field of Classification Search
CPC ............................... H01L 24/83; H01L 24/97
See application file for complete search history.

(56) References Cited

U.S. PATENT DOCUMENTS

| 8,835,221 B2 * | 9/2014 | Lee .................. H01L 23/49822 438/107 |
| 2012/0273964 A1 | 11/2012 | Kanki et al. |
| 2013/0087916 A1 | 4/2013 | Lin et al. |

FOREIGN PATENT DOCUMENTS

| KR | 20120115130 A | 10/2012 |
| KR | 20130078948 A | 7/2013 |

* cited by examiner

*Primary Examiner* — Daniel Shook

(57) ABSTRACT

Provided are a semiconductor package and a method for manufacturing a semiconductor package. The method for manufacturing a wafer-level fan-out package includes attaching semiconductor chips sawed to have a predetermined size to one surface of a wafer at predetermined intervals, forming a first passivation layer on surfaces of the semiconductor chips and the wafer, forming a redistribution layer electrically connected to the semiconductor chips on portions of an upper surface of the first passivation layer, forming a second passivation layer on the upper surface of the first passivation layer and surfaces of portions of the redistribution layer, forming external connection terminals on portions of the redistribution layer in which the second passivation layer has not been formed, and performing sawing along package boundary lines (sawing lines) and polishing the wafer to be removed such that lower surfaces of the semiconductor chips are exposed.

6 Claims, 5 Drawing Sheets

METHOD FOR MANUFACTURING WAFER-LEVEL FAN-OUT PACKAGE

CROSS-REFERENCE TO RELATED APPLICATIONS

This application claims priority under 35 U.S.C. §119 to Korean Patent Application No. 10-2015-0079377, filed on Jun. 4, 2015, the disclosure of which is incorporated herein by reference in its entirety.

TECHNICAL FIELD

The present invention relates to a semiconductor package, and more particularly, to a method for manufacturing a semiconductor package, which eliminates a molding process during a packaging process and easily achieves a fan out package structure while suppressing generation of cracks and warpage.

BACKGROUND

Semiconductor industries have become increasingly lighter, smaller, and multi-functional, and have higher performance at low cost. One of key technologies required to come up with the tendency is an integrated circuit (IC) packaging technology.

IC packaging refers to packaging for protecting a semiconductor chip such as a single device or an integrated circuit formed by stacking various electronic circuits and wirings from various external environment such as dust, moisture, and electrical and mechanical load, forming signal input/output terminals to and from a main board using a lead frame or a printed circuit board (PCB), and molding the resultant structure using an encapsulant in order to optimize and maximize electrical performance of a semiconductor chip.

A packaging process to form a semiconductor package refers to a series of processes of connecting an external connection terminal to a semiconductor chip and sealing the semiconductor chip to protect the semiconductor chip from an external impact.

Recently, as electronic industries have advanced, semiconductor packages have been moving towards a reduction in size, weight, and manufacturing cost. Also, as application fields of semiconductor packages extend to digital image devices, MP3 players, mobile phones, and large storages, various types of semiconductor packages have been introduced. A ball grid array (BGA) package and a wafer level chip scale package (WLCSP), among the semiconductor packages, are most generalized semiconductor packages.

In the WLCSP, a structure in which solder balls are directly attached to a semiconductor chip is called a fan-in structure, and a structure in which some of solder balls are attached to a substrate outside of a semiconductor chip is called a fan-out structure.

FIGS. 1A through 1E are cross-sectional views sequentially illustrating a process of manufacturing a wafer level package according to a related art.

First, lower surfaces of individual chips 10 separated in a wafer state are attached to an upper surface of a carrier wafer (or a mold frame) 12 at predetermined intervals by using a double-sided adhesive tape 11 (please refer to FIG. 1A).

Next, all of the individual chips 10 are molded with a molding compound resin 20 such that upper surfaces and side surfaces of the chips 10 are encapsulated by the molding compound resin 20 having a predetermined thickness (please refer to FIG. 1B).

Subsequently, the molding compound resin 20 including the individual chips 10 are removed from the attachment surface of the carrier wafer to expose lower surfaces of the individual chips outwardly. In this state, a grinding process is performed to make the upper surface of the molding compound resin 20 and the lower surfaces of the individual chips 10 even, and a cleaning process is performed on the lower surfaces of the chips 10 (please refer to FIG. 1C).

Thereafter, a process of forming a redistribution layer (RDL), i.e., a metal line, and bumps 40 from a bonding pad of each chip 10 to a desired position of the lower surface of the molding compound resin 20 is performed (please refer to FIG. 1D).

The redistribution layer refers to a metal line extending outwardly from the bonding pad such that input/output terminals such as solder balls may be attached at wide pitches to thus solve a problem of an electrical short caused as the input/output terminals attached to bonding pads of the chips at fine pitches are in contact with each other.

Here, in general, a passivation layer is formed on a surface of each chip excluding the bonding pad, the redistribution layer is formed thereon through a plating process, and an insulating passivation layer preventing penetration of moisture or various foreign materials into the redistribution layer and a short circuit phenomenon between the redistribution layers is also formed thereon. A specific formation process thereof will be omitted.

Finally, a process of sawing is performed along sawing lines (boundary lines of the package of the molding compound resin), completing individual wafer level fan-out packages each including the individual chip 10, the molding compound resin 20 formed around the individual chip 10, the lower redistribution layer 30, and the bumps 40 (please refer to FIG. 1E).

However, in the related art wafer level package manufacturing process, since the process of molding the molding compound resin should be performed, the number of processes increases and an operation time is lengthened.

Also, since the molding compound resin serves as a wafer, the fan-out package is frequently warped during a bumping process, and in a worst case scenario, cracks are generated.

SUMMARY

Accordingly, the present invention provides a method for manufacturing a semiconductor package, which eliminates a molding process during a packaging process and easily achieves a fan out package structure while suppressing generation of cracks and warpage.

The object of the present invention is not limited to the aforesaid, but other objects not described herein will be clearly understood by those skilled in the art from descriptions below.

In one general aspect, a method for manufacturing a wafer-level fan-out package includes: attaching semiconductor chips sawed to have a predetermined size to one surface of a wafer at predetermined intervals; forming a first passivation layer on surfaces of the semiconductor chips and the wafer; forming a redistribution layer electrically connected to the semiconductor chips on portions of an upper surface of the first passivation layer; forming a second passivation layer on the upper surface of the first passivation layer and surfaces of portions of the redistribution layer; forming external connection terminals on portions of the redistribution layer in which the second passivation layer has not been formed; and performing sawing along package boundary lines (sawing lines) and polishing the wafer to be removed such that lower surfaces of the semiconductor chips are exposed. The first passivation layer may be manufactured to have a single layer structure having a thickness of 50 µm or more or to have a multilayer structure that includes a plurality of layers each having a thickness of 20 µm or less.

The attaching of semiconductor chips may include: attaching the lower surfaces of the semiconductor chips to one surface of a double-sided adhesive film; and attaching the other surface of the double-sided adhesive film to an upper surface of the wafer.

The forming of a first passivation layer may include: forming the first passivation layer to have a predetermined height such that upper surfaces of the semiconductor chips can be coated and such that portions of the upper surfaces of the semiconductor chips are exposed.

The forming of a redistribution layer may include: forming a photoresist template having an intaglio pattern through a photolithography process using a photomask; plating a metal for redistribution layer in recesses formed in the photoresist template; and removing the photoresist template.

The forming of a photoresist template may include: forming a photoresist layer on an upper surface of the first passivation layer; and aligning the photomask with the photoresist template pattern formed thereon on an upper surface of the photoresist layer and irradiating light thereto to remove the photoresist layer corresponding to a redistribution layer region.

Other features and aspects will be apparent from the following detailed description, the drawings, and the claims.

DETAILED DESCRIPTION OF EMBODIMENTS

Figure 1A:
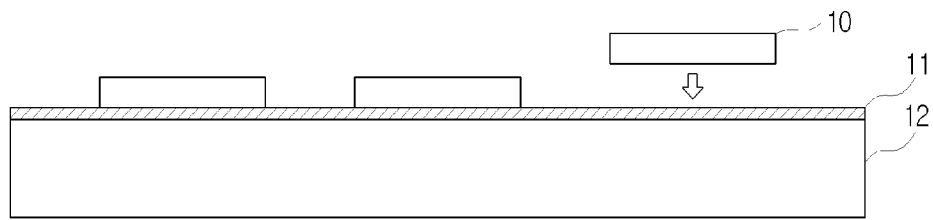
FIGS. 1A through 1E are cross-sectional views sequentially illustrating a process of manufacturing a wafer level package according to a related art.
Figure 1B:
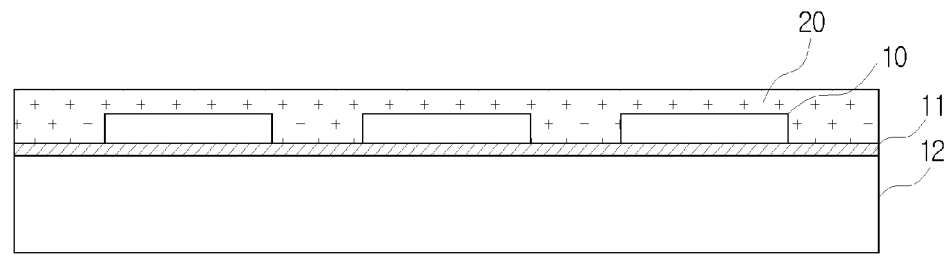
Figure 1C:
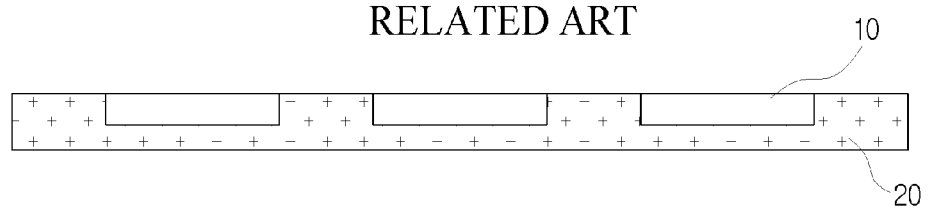
Figure 1D:
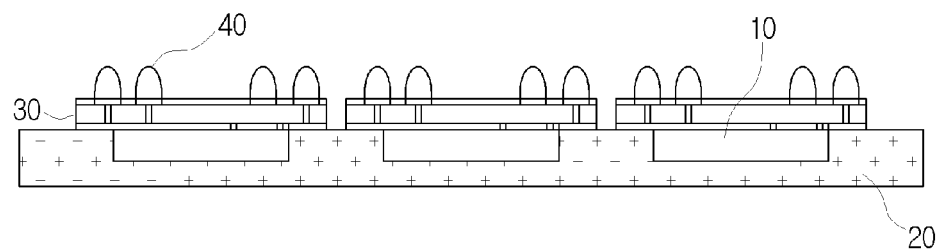
Figure 1E:
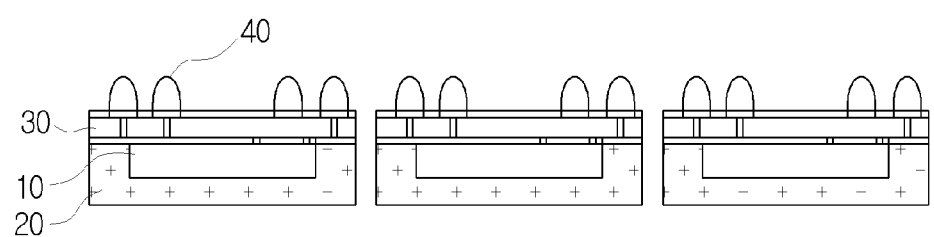

The advantages, features and aspects of the present invention will become apparent from the following description of the embodiments with reference to the accompanying drawings, which is set forth hereinafter. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The terms used herein are for the purpose of describing particular embodiments only and are not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the present invention will be described in detail with reference to the accompanying drawings. In adding reference numerals for elements in each figure, it should be noted that like reference numerals already used to denote like elements in other figures are used for elements wherever possible. Moreover, detailed descriptions related to well-known functions or configurations will be ruled out in order not to unnecessarily obscure subject matters of the present invention.

FIGS. 2A through 2G are cross-sectional views illustrating a process of a method of manufacturing a wafer-level fan-out package according to an embodiment of the present invention.

Figure 2A:
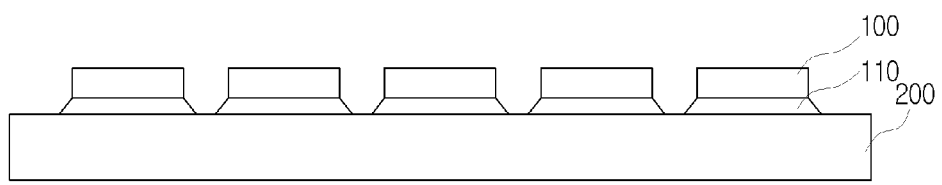
FIGS. 2A through 2G are cross-sectional views illustrating a process of a method of manufacturing a wafer-level fan-out package according to an embodiment of the present invention.

First, as illustrated in FIG. 2A, semiconductor chips 100 obtained from a sawing process such that the semiconductor chips 100 have a predetermined size are attached to one surface of a wafer 200 at predetermined intervals. Here, in order to attach the semiconductor chips 100 to one surface of the wafer 200, a double-sided adhesive tape 110 may be used, and the double-sided adhesive tape 110, called a die adhesive film or dicing attach film (DAF), is generally used for the purpose of attaching a patterning-finished wafer to a package. One surface of the DAF is attached to the lower surfaces of the individual semiconductor chips 100 sawed to have a predetermined size, and the other surface thereof is attached to an upper surface of the wafer 200, whereby the individual semiconductor chips 100 are bonded to the one surface of the wafer 200 at predetermined intervals. Here, as the wafer 200, a silicon-bare wafer or a tempered glass wafer may be used, and the wafer 200 is retained until the sawing process is finished (to be described hereinafter) to minimize warpage that may occur due to a process of forming an external connection terminal.

Figure 2B:
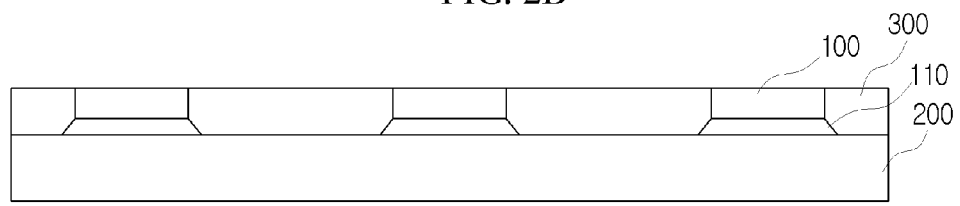

Next, as illustrated in FIG. 2B, a first passivation layer 300 is formed on the wafer 200 with the semiconductor chips 100 attached thereto. The first passivation layer 300 may be a multilayer including various insulating films formed of polyimide (PI), polybenzoxazole (PBO), EMC, resins, or phenol+rubber type. The first passivation layer 300 may be formed to have such a height that upper surfaces of the semiconductor chips 100 attached to the upper surface of the wafer 200 may be coated. Here, the first passivation layer 300 is patterned to form openings exposing portions of the semiconductor chips 100. Here, the openings of the first passivation layer 300 may be formed using a general photo process. Here, the first passivation layer 300 may be manufactured to have a single layer structure having a thickness of 50 µm or more or to have a multilayer structure that includes a plurality of layers each having a thickness of 20 µm or less.

Figure 2C:
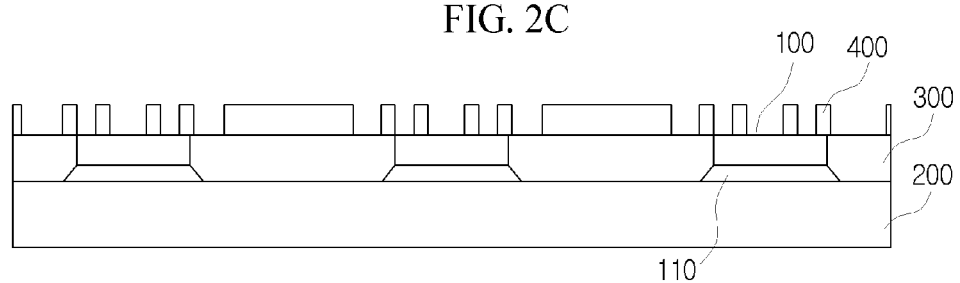

Thereafter, as illustrated in FIG. 2C, a photoresist template 400 serving to form a redistribution layer (RDL) is formed on the first passivation layer 300. The photoresist template 400 is formed to have an intaglio pattern on the first passivation layer 300 through a photolithography process using a photomask. In detail, the photoresist template 400 may be formed through a process of forming a photoresist layer on an upper surface of the first passivation layer 300 and a process of aligning the photomask with a photoresist template pattern formed thereon on an upper surface of the photoresist layer and irradiating light thereto to remove the photoresist layer corresponding to a redistribution layer region. Here, the photomask has a pattern such that light may not be irradiated to the photoresist layer therebelow.

The photoresist may be a photosensitive resin, i.e., a positive photoresist in which polymers are solubilized only in a portion to which light is irradiated and resist disappears. For example, polymethyl methacrylate, napthoquinonediazide, or polybutene-1-sulfone may be used as the positive photoresist.

Figure 2D:
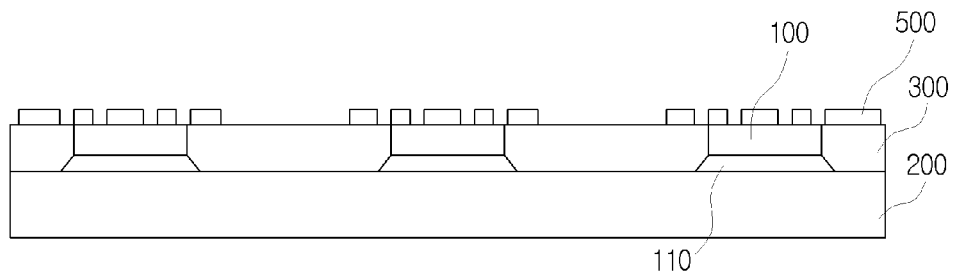

Subsequently, as illustrated in FIG. 2D, a process of plating a metal for redistribution layer in recesses formed in the photoresist template 400 and removing the photoresist template 400 is performed to form a redistribution layer 500 on the first passivation layer 300. The redistribution layer 500 is connected to an electrode pad positioned in a predetermined region of the semiconductor chip 100 to extend the electrode pad along the redistribution layer 500. Here, the photoresist template 400 may be removed through a developing process. As a developer of the photoresist, a water-soluble alkaline solution may be used, and as a main material, a KOH and TMAH (TetraMethyl-Ammonium-Hydroxide) aqueous solution is used. When the developing process is finished, the developer may be removed and hard baking may be performed as necessary.

Figure 2E:
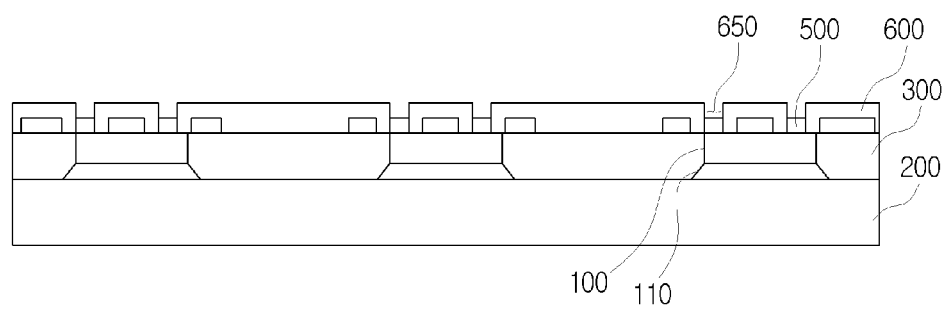

Thereafter, as illustrated in FIG. 2E, a second passivation layer 600 is formed on the upper surface of the first passivation layer 300 and on the upper surface of the redistribution layer 500. Like the first passivation layer 300, the second passivation layer 600 may be formed of lead oxide (PbO, PbO$_2$, Pb$_3$O$_4$), polyimide (PI), or multilayer including these materials. The second passivation layer 600 is patterned to form openings 650 exposing portions of the redistribution layer 500. The openings 650 of the second passivation layer 600 may be formed using a general photo process.

Figure 2F:
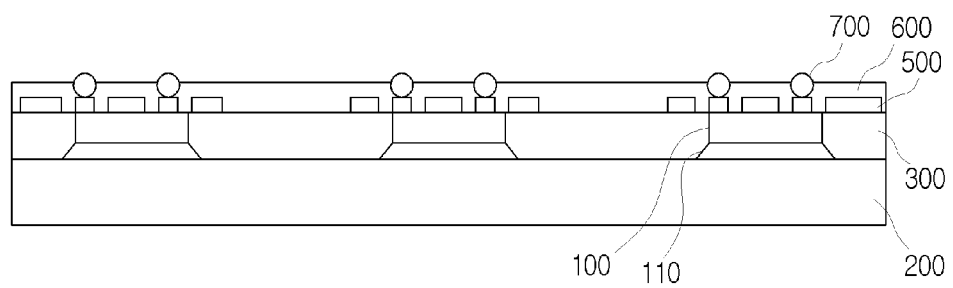

Thereafter, as illustrated in FIG. 2F, external connection terminals 700 are formed to be electrically connected to the redistribution layer 500 within the openings 650 of the second passivation layer 600. The external connection terminals 700 may be, for example, bumps, solder balls, or bonding wires, and may include gold, silver, copper, tin, or nickel. Also, a reflow process may be performed to enhance electrical connection between the redistribution layer 500 and the external connection terminals 700.

Figure 2G:
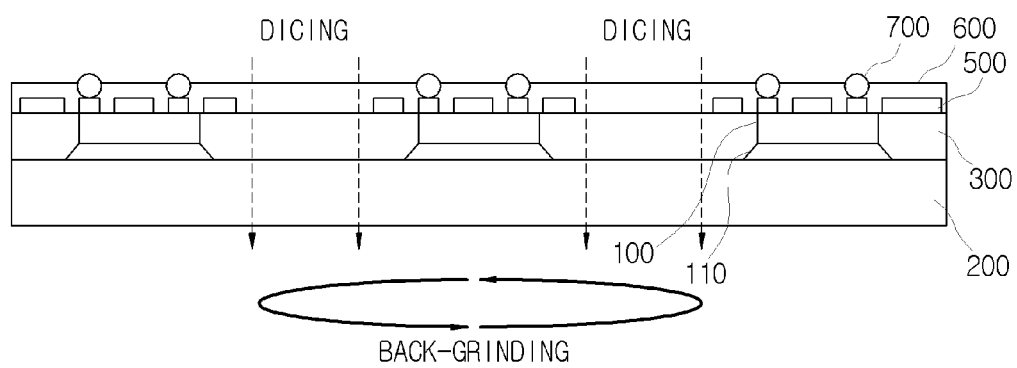
Figure 3:
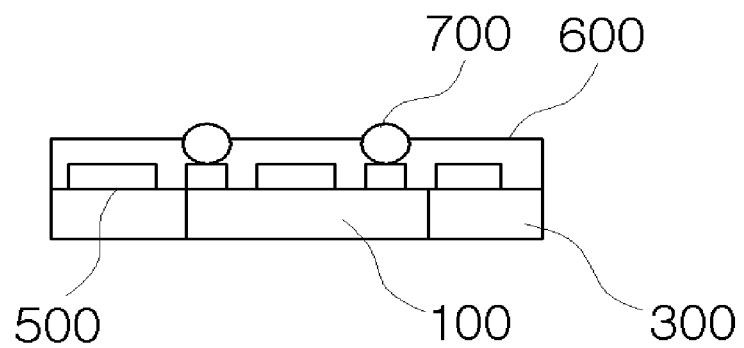
FIG. 3 is a cross-sectional view illustrating a wafer-level fan-out package according to an embodiment of the present invention.

Thereafter, as illustrated in FIG. 2G, a sawing process is performed along the boundary lines (sawing lines) of the packages to singulate individual fan out packages, and the wafer 200 is back-ground to expose a lower surface of the semiconductor chip 100 as illustrated in FIG. 3.

FIG. 3 is a cross-sectional view illustrating a wafer-level fan-out package according to an embodiment of the present invention.

Referring to FIG. 3, a wafer-level fan-out package according to an embodiment of the present invention includes a semiconductor chip 100 and a first passivation layer 300 surrounding the semiconductor chip 100. The first passivation layer 300 is patterned to form openings exposing portions of the semiconductor chip 100, and a redistribution layer 500 is arranged in the openings and connected to an electrode pad positioned in a predetermined region of the semiconductor chip 100 to extend the electrode pad along the redistribution layer. A second passivation layer 600 is formed on an upper surface of the first passivation layer 300 and an upper surface of the redistribution layer 500. The second passivation layer 600 is patterned to form openings exposing portions of the redistribution layer 500. External connection terminals 700 are formed to be electrically connected to the redistribution layer 500 within the openings 650 of the second passivation layer 600.

As described above, according to the present invention, since a molding process is omitted during a semiconductor package process, an operation time is shortened, enhancing production yield, and since silicon (Si) or glass wafer having strength greater than that of a molding compound resin is used, a fan out package structure may be easily manufactured, while suppressing generation of cracks and warpage during a bumping process. Also, since the wafer is retained until the sawing process is terminated, warpage that may occur due to a process of forming the external connection terminals may be minimized.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method for manufacturing a wafer-level fan-out package, the method comprising:
    attaching semiconductor chips sawed to have a predetermined size to one surface of a wafer at predetermined intervals;
    forming a first passivation layer on surfaces of the semiconductor chips and the wafer;
    forming a redistribution layer electrically connected to the semiconductor chips on portions of an upper surface of the first passivation layer;
    forming a second passivation layer on the upper surface of the first passivation layer and surfaces of portions of the redistribution layer;
    forming external connection terminals on portions of the redistribution layer in which the second passivation layer has not been formed; and
    performing sawing along package boundary lines and polishing the wafer to be removed such that lower surfaces of the semiconductor chips are exposed.

2. The method of claim 1, wherein the attaching of semiconductor chips includes:
    attaching the lower surfaces of the semiconductor chips to one surface of a double-sided adhesive film; and
    attaching the other surface of the double-sided adhesive film to an upper surface of the wafer.

3. The method of claim 1, wherein the forming of a first passivation layer includes forming the first passivation layer to have a predetermined height such that upper surfaces of the semiconductor chips can be coated and such that portions of the upper surfaces of the semiconductor chips are exposed.

4. The method of claim 1, wherein the first passivation layer is formed to have a single layer structure having a thickness of 50 μm or more or to have a multilayer structure that includes a plurality of layers each having a thickness of 20 μm or less.

5. The method of claim 1, wherein the forming of a redistribution layer includes:
    forming a photoresist template having an intaglio pattern through a photolithography process using a photomask;
    plating a metal for redistribution layer in recesses formed in the photoresist template; and
    removing the photoresist template.

6. The method of claim 5, wherein the forming of a photoresist template includes:

forming a photoresist layer on an upper surface of the first passivation layer; and aligning the photomask with the photoresist template pattern formed thereon on an upper surface of the photoresist layer and irradiating light thereto to remove the photoresist layer corresponding to a redistribution layer region.

\* \* \* \* \*